(12) United States Patent
Kobayashi et al.

(10) Patent No.: US 6,480,133 B2
(45) Date of Patent: Nov. 12, 2002

(54) LOW-POWER ANALOG-TO-DIGITAL CONVERTER

(75) Inventors: Haruo Kobayashi, 620-12-1-202, Aioi-cho 2-chome, Kiryu-shi, Gunma (JP); Yasuyuki Kimura, Gunma (JP)

(73) Assignees: Sanyo Electric Co., Ltd. (JP); Haruo Kobayashi (JP)

( * ) Notice: Subject to any disclaimer, the term of this patent is extended or adjusted under 35 U.S.C. 154(b) by 0 days.

(21) Appl. No.: 09/766,257

(22) Filed: Jan. 19, 2001

(65) Prior Publication Data

US 2001/0040522 A1 Nov. 15, 2001

(30) Foreign Application Priority Data

Jan. 21, 2000 (JP) .......................... 2000-012706

(51) Int. Cl.[7] .............................. H03M 1/12; H03M 1/36
(52) U.S. Cl. ........................................ 341/156; 341/159
(58) Field of Search ................................. 341/156, 159, 341/97; 257/360, 500; 327/94, 542

(56) References Cited

U.S. PATENT DOCUMENTS 5,309,157 A * 5/1994 Yee ............................. 341/156
6,175,323 B1 * 1/2001 Flynn ........................... 341/156
6,239,733 B1 * 5/2001 Lin ............................... 341/159

FOREIGN PATENT DOCUMENTS

JP          8149006          6/1996          ............ H03M/1/12

* cited by examiner

Primary Examiner—Patrick Wamsley
(74) Attorney, Agent, or Firm—Fish & Richardson, P.C.

(57) ABSTRACT

An A/D converter having folding circuits for being supplied with analog signal pairs and reference voltage pairs and for outputting folded differential current pairs; first comparators for comparing the differential current pairs supplied from the folding circuits and for outputting higher 3 bits of a Gray code; sine wave generators for outputting 4-phase sine wave pairs; a current interpolation circuit for interpolating the 4-phase sine wave pairs and outputting 32 sine wave pairs; second comparators for comparing the sine wave pairs with each other respectively: and a Gray code encoder for encoding the outputs of the second comparators into lower 5 bits of the Gray code. Thus, the A/D converter can be made high in speed, lower in operating voltage, finer in density and higher in integration.

11 Claims, 16 Drawing Sheets

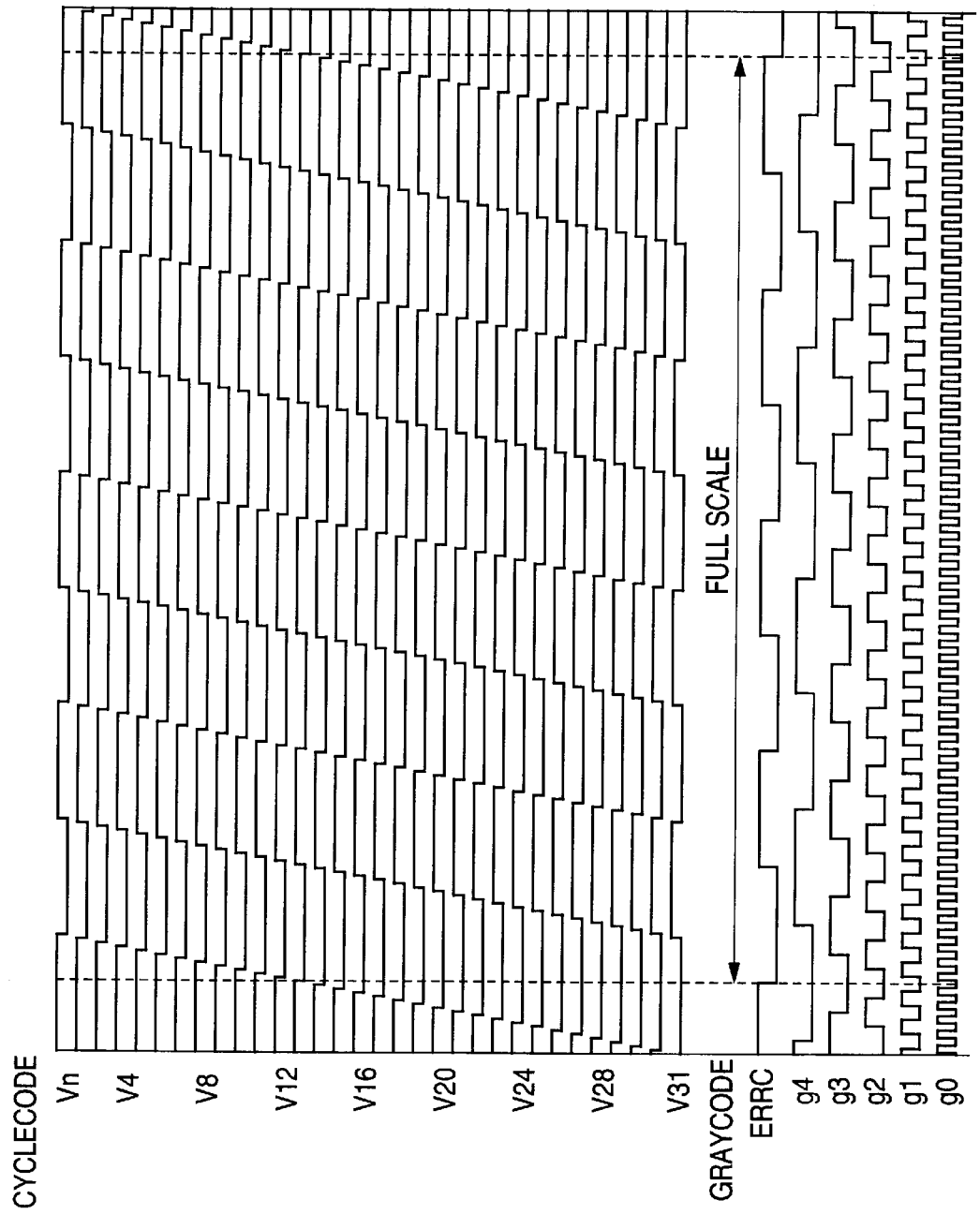

CIRCUITRY

INPUT/OUTPUT PROPERTY

THE INTERSECTION POINT MOVES IN ACCORDANCE WITH A REFERENCE VOLTAGE (2) FOLD6 (FOLDOU)

(3) FOLD5

SINE WAVE GENERATOR  (a) CIRCUIT  (b) INPUT/OUTPUT PROPERTY

CURRENT INTERPOLATION CIRCUIT

INTERPOLATION EXAMPLE

LOW-POWER ANALOG-TO-DIGITAL CONVERTER

BACKGROUND OF THE INVENTION

The present invention relates to an analog-to-digital converter (A/D converter), and particularly relates to a high-speed A/D converter which can operate at a low voltage and which is reduced in circuit size (number of circuit elements) and in power consumption. The A/D converter according to the present invention is suitable to any product for performing digital signal processing, particularly to a product of a measuring instrument such as an FTT analyzer, a digital oscilloscope, or the like.

As a conventional fastest A/D converter, there is known a parallel-connected (flash) A/D converter. The circuitry of the A/D converter is formed by bit-resolution comparators numbering 2 to some power. For example, if the resolution is 8 bits, it is necessary to provide 256 (=$2^8$) comparators and dispose a digital encoder with a large circuit quantity in the following stage of the comparators.

Therefore, in the conventional parallel-connected A/D converter, the circuit quantity and the power consumption become enormous, and the input capacitance also increases so that the high-frequency properties deteriorate. In a conventional circuit system used in the A/D converter, there is often used a voltage-mode circuit which carries out an operation in a voltage area. However, when the power supply voltage is reduced as integrated circuits are made finer, such a circuit system cannot deal with such a reduced voltage.

On the contrary, a folding-interpolation A/D converter has an advantage that the circuit quantity, the power consumption and the input capacitance are smaller than those of the parallel-connected A/D converter in spite of a high-speed property substantially equal to that of the parallel-connected A/D converter. As a prior art of such a folding-interpolation A/D converter, there is, for example, that which is disclosed in JP-A-8-149006.

SUMMARY OF THE INVENTION

As described above, the parallel-connected A/D converter has a problem that the circuit quantity, the power consumption and the input capacitance are large. On the other hand, the folding/interpolation A/D converter is a promising technique to solve such problems. However, most of proposed ones use a bipolar transistor circuit. Therefore, they cannot deal with a reduced power supply voltage, a finer integrated circuit, and reduced power consumption, satisfactorily.

Therefore, the present inventors made diligent investigation about a high-speed A/D converter, and at last developed a novel architecture of a high-speed A/D converter using a CMOS transistor circuit.

That is, the present invention is an evolution of a conventional folding/interpolation A/D converter. It is an object of the present invention to provide an A/D converter in which particularly an analog preprocessing circuit in an input stage of the A/D converter is devised to improve the A/D conversion properties, to make it possible to reduce a power supply voltage, and to provide fine and high-density integrated circuits.

According to a first aspect of the present invention, there is provided an A/D converter for converting an input analog signal into a Gray code of higher m bits and lower n bits, which comprises: m folding circuits for being supplied with analog signal pairs and reference voltage pairs and for outputting folded differential current pairs respectively; m first comparators for comparing the differential current pairs outputted by the folding circuits and for outputting the higher m bits of the Gray code; a plurality of sine wave generators for being supplied with the analog signal pairs and the reference voltage pairs and for outputting multi-phase sine wave pairs respectively; a current interpolation circuit for interpolating the multi-phase sine wave pairs and for outputting $2^n$ sine wave pairs; $2^n$ second comparators for comparing the sine wave pairs and for outputting binary data respectively; and a Gray code encoder for encoding the binary data into a Gray code of lower n bits; wherein the lower n bits of the Gray code are outputted from the Gray code encoder.

According to such an A/D converter, it is possible to reduce the total circuit quantity and the total power consumption on a large scale while keeping a speed substantially equal to that of the conventional parallel-connected A/D converter.

According to a second aspect of the present invention, in the above A/D converter according to the first aspect, preferably, the A/D converter further comprises: a track hold circuit for temporarily holding and outputting levels of the analog signal pairs in accordance with a clock signal; wherein the analog signal pairs are supplied, through the track hold circuit, to the folding circuits and the sine wave generators, the first and second comparators being operated synchronously with the clock signal.

According to such an A/D converter according to the second aspect, an A/D conversion error due to signal delay can be prevented from occurring, so that it is possible to improve the A/D conversion accuracy.

According to a third aspect of the present invention, in the above A/D converter according to the first and second aspects of the invention, preferably, the A/D converter further comprises: pre-amplifiers for amplifying potential differences between the analog signal pairs and the reference voltage pairs and for outputting differential voltage pairs respectively; wherein outputs of the pre-amplifiers are supplied to the folding circuits.

According to such an A/D converter according to the third aspect of the invention, it is possible to improve the A/D conversion accuracy.

According to a fourth aspect of the invention, in the above A/D converter according to the third aspect of the invention, preferably, the folding circuits includes: differential MOS transistor pairs having gates supplied with the differential voltage pairs respectively; a current source for supplying a first current to the differential MOS transistor pairs; and a current mirror circuit for supplying a second current to a pair of current channels; wherein drains of the differential MOS transistor pairs are cross-connected alternately to the pair of current channels so that folded differential current pairs are outputted from ends of the pair of current channels.

According to such an A/D converter, the voltage can be reduced by the current-mode CMOS arrangement.

According to a fifth aspect of the invention, there is provided an A/D converter for outputting a digital signal of m+n bits, which comprises: folding circuits for being supplied with differential analog signals and for outputting higher m bits of the digital signal respectively; sine wave generators for being supplied with the differential analog signals and for outputting lower n bits of the digital signal respectively; and a current interpolation circuit for interpolating outputs of the sine wave generators; the folding circuits including: at least one differential MOS transistor pair having gates supplied with differential voltage pairs which are differences between the differential analog signals and differential reference voltages, respectively; a current source for supplying a first current to the differential MOS transistor pairs; and a current mirror circuit for supplying a second current to a pair of current channels; wherein drains of the differential MOS transistor pairs are cross-connected alternately to the pair of current channels so that folded differential current pairs are outputted from ends of the pair of current channels.

It is possible to reduce the total circuit quantity and the total power consumption on a large scale while keeping a speed substantially equal to that of the conventional parallel-connected A/D converter. In addition, the voltage can be reduced by the current-mode CMOS arrangement.

According to a sixth aspect of the invention, in the A/D converter according to the fifth aspect, preferably, the A/D converter further comprises a current comparator for comparing the differential current pair and for outputting a Gray-coded digital signal.

According to a seventh aspect of the invention, in the A/D converter according to the sixth aspect of the invention, preferably, an A/D converter for outputting a digital signal of m+n bits, comprises; folding circuits for being supplied with differential analog signals and for outputting higher m bits of the digital signal respectively; sine wave generators for being supplied with the differential analog signals and for outputting lower n bits of the digital signal respectively; and a current interpolation circuit for interpolating outputs of the sine wave generators; the sine wave generators including: a plurality of differential MOS transistor pairs having gates supplied with differential voltage pairs which are differences between the differential analog signals and differential reference voltages, respectively; a current source for supplying a first current to the differential MOS transistor pairs; and a current mirror circuit for supplying a second current to a pair of current channels; wherein drains of the differential MOS transistor pairs are cross-connected alternately to the pair of current channels so that sine wave currents are outputted from ends of the pair of current channels.

According to such an A/D converter, it is possible to reduce the total circuit quantity and the total power consumption on a large scale while the voltage can be reduced by the current-mode CMOS arrangement.

According to an eighth aspect of the invention, in the A/D converter according to the seventh aspect of the invention, preferably, the current interpolation circuit makes current interpolation among a plurality of sine wave currents the phases of which are shifted sequentially, and the current interpolation circuit includes: current dividing means for dividing the sine wave current into a plurality of currents in a predetermined ratio; and adding means for adding the divided currents so as to make current interpolation among the plurality of sine wave currents; wherein the sine wave current is supplied directly to the current dividing means.

According to such an A/D converter, an interface portion such as a conventional buffer circuit or the like can be omitted.

According to a ninth aspect of the invention, in the A/D converter according to the eighth aspect of the invention, preferably, the current dividing means is constituted by a plurality of MOS transistors which are different in gate width from each other and which are connected in parallel.

According to such an A/D converter, because the current dividing ratio is determined by the gate widths of the MOS transistors, it is possible to improve the interpolation accuracy.

BRIEF DESCRIPTION OF THE DRAWINGS

FIG. 7 is a waveform chart for explaining the operation of the A/D converter according to the embodiment of the present invention;

DETAILED DESCRIPTION OF THE PREFERRED EMBODIMENT

Figure 1:
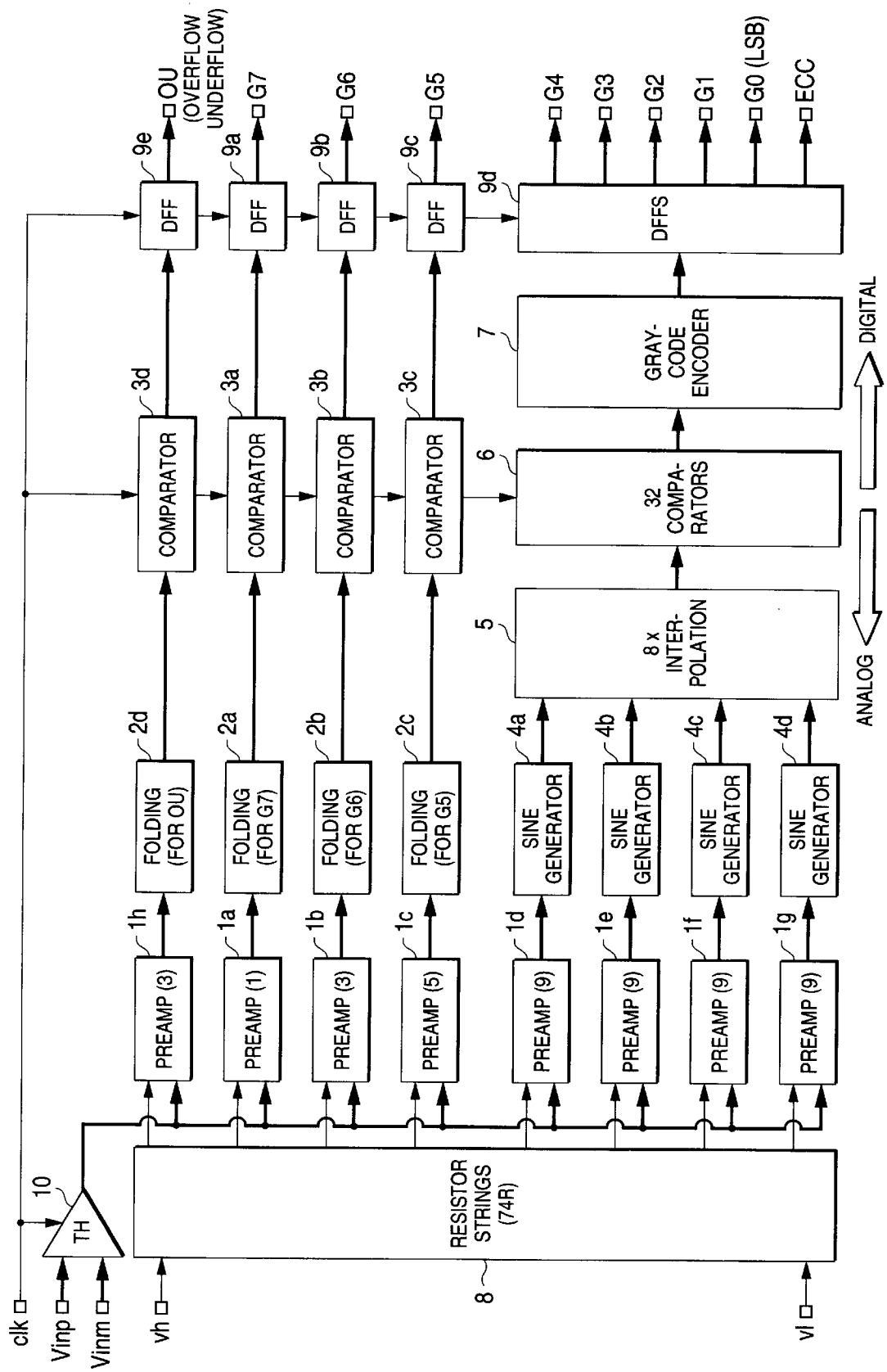
FIG. 1 is a diagram showing functional blocks of a folding/interpolation A/D converter according to an embodiment of the present invention.

Next, an embodiment of the present invention will be described in detail with reference to FIGS. 1 to 18. First, description will be made about the outline of the architecture of an A/D converter according to the present invention with reference to FIG. 1. FIG. 1 is a functional block diagram of a folding-interpolation A/D converter according to the embodiment.

This A/D converter has 8-bit resolution, but, in the A/D converter, different architectures are adopted between a circuit for generating higher 3 bits of digital data and a circuit for generating lower 5 bits of digital data. The circuit for generating higher 3 bits has a folding architecture. The circuit for generating lower 5 bits has an architecture in which folding and interpolation are combined.

The folding architecture is constituted by pre-amplifiers 1a to 1c for amplifying potential differences between differential analog input signals (Vinp/Vinm) and differential reference voltages (Vrefp/Vrefn), 3 folding circuits 2a to 2c for outputting differential current pairs folded by receiving the outputs of the pre-amplifiers 1a to 1c, and three comparators 3a to 3c for comparing the differential current pairs and outputting higher 3 bits of a Gray code. The comparators 3a to 3c are current comparators.

On the other hand, the folding/interpolation architecture corresponding to lower 5 bits is constituted by pre-amplifiers 1d to 1g, sine wave generators 4a to 4d for outputting 4-phase sine wave pairs the phases of which are shifted by 45° sequentially in accordance with the outputs of the pre-amplifiers 1d to 1g, a current interpolation circuit 5 for interpolating the 4-phase sine wave pairs and outputting 32 sine wave pairs the phases of which are shifted by 5.625° sequentially, 32 comparators 6 for comparing the sine wave pairs and outputting binary data, and a Gray code encoder 7 for encoding the binary data into an n-bit Gray code. Incidentally, although the 4-phase sine wave pairs the phases of which are shifted by 45° sequentially are generated in this embodiment, the present invention is not limited thereto, but may be designed so that, for example, two-phase sine wave pairs the phases of which are shifted by 90° sequentially are generated and interpolated. In this case, it will go well if two sine wave generators are provided.

From the point of view of signal processing, the architecture has an analog preprocessing circuit in the left side and a digital circuit in the right side with respect to the comparators 3a to 3c and 6 which are aligned, as the boundary near the center of FIG. 1. The analog preprocessing circuit is the general term for the pre-amplifiers 1a to 1g, the folding circuits 2a to 2c, the sine wave generators 4a to 4d, and the current interpolation circuit 5.

An analog signal which is a target for A/D conversion is supplied as differential analog input signals (Vinp/Vinm). The differential reference voltages (Vrefp/Vrefm) are generated from connection nodes of 72 resistor strings 8. The differential analog input signals (Vinp/Vinm) are analog-encoded by the above-mentioned analog preprocessing circuit, and thereafter digitized by the comparators 3a to 3c and 6.

Here, the outputs of the comparators 3a to 3c are used directly as higher 3 bits (G7, G6 and G5) of a Gray code. Lower 5 bits are encoded into Gray code bits (G4 to G0) by the Gray code encoder 7. The eight bits (G7 to G0) of the Gray code are outputted through DFFs 9a to 9d at a fixed timing.

Although the main portion of the architecture of the A/D converter according to the embodiment is configured as described above, an overflow/underflow detection bit (OU), an error correction bit (ERRC) are also outputted in the architecture. A circuit for overflow/underflow detection has a configuration similar to the folding architecture for the higher 3 bits. That is, the circuit is constituted by a pre-amplifier 1h, a folding circuit 2d and a comparator 3d.

The differential analog input signals (Vinp/Vinm) are sampled and held by a track hold circuit 10, and thereafter applied to the pre-amplifiers 1a to 1g. The track hold circuit 10 samples the differential analog input signals (Vinp/Vinm), for example, in every period when a clock signal clk is in an H-level. The track hold circuit 10 holds and outputs the levels of the signals during the period.

The clock signal clk is supplied to the comparators 3a to 3d and 6 and the DFFs 9a to 9e in common so as to synchronize the operations of those circuits, That is, the comparators 3a to 3d perform a comparison operation in the period when the clock signal clk is in the H-level. Consequently, an A/D conversion error due to signal delay is prevented from occurring, so that the A/D conversion accuracy can be improved.

Figure 2:
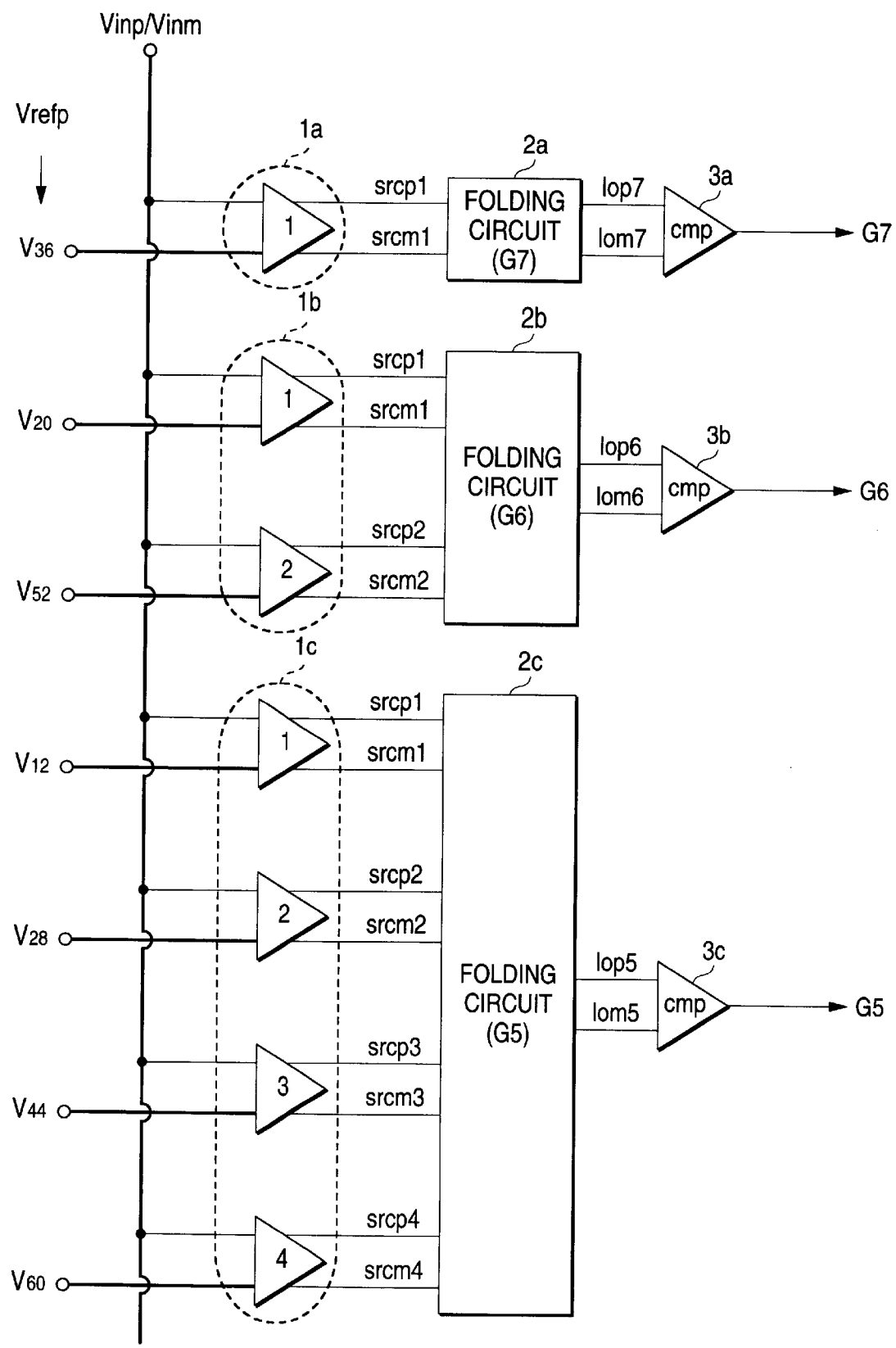
FIG. 2 is a detailed block diagram showing a folding architecture according to the embodiment of the present invention.

Next, description will be made in more detail about a block configuration of the above-mentioned A/D converter, with reference to FIGS. 2 and 3. FIG. 2 is a detailed block diagram showing a folding architecture for generating higher 3 bits. On the other hand, FIG. 3 is a detailed block diagram showing a folding/interpolation architecture for generating lower 5 bits.

In FIG. 2, the pre-amplifiers 1a, 1b and 1c are supplied not only with differential analog input signals Vinp/Vinm in common but also with different differential reference voltages Vrefp/Vrefm generated from the resistor strings 8. The pre-amplifiers 1a, 1b and 1c include one, two and four differential amplifiers, respectively. The pre-amplifiers 1a, 1b and 1c output differential voltage pairs <srcp1, srcm1> to <srcp4, srcm4>. These differential voltage pairs are supplied to the corresponding folding circuits 2a to 2c. Then, the folding circuits 2a to 2c supply folded differential current pairs <Iop7, Iom7>, <Iop6, Iom6> and <Iop5, Iom5> to the comparators 3a to 3c, correspondingly and respectively. Incidentally, only the reference voltages Vrefp (V36, V20, V52, . . . ) on the plus side are shown in FIG. 2 for the sake of simplification.

Figure 3:
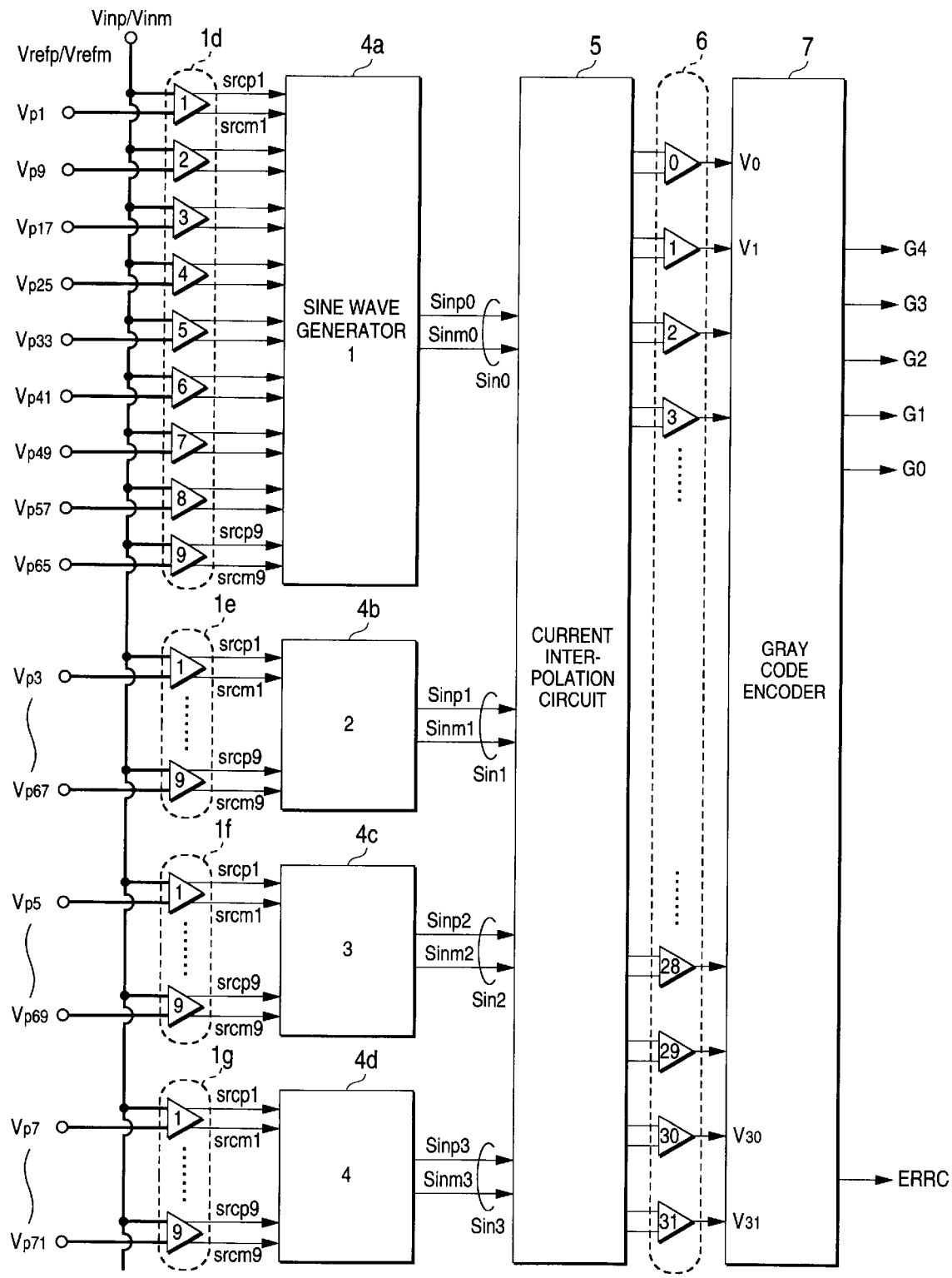
FIG. 3 is a detailed block diagram showing a folding/interpolation architecture according to the embodiment of the present invention.

On the other hand, in FIG. 3, the pre-amplifiers 1d, 1e, 1f and 1g are supplied not only with the differential analog input signals Vinp/Vinm in common but also with different differential reference voltages Vrefp/Vrefm generated from the resistor strings 8. Each of the pre-amplifiers 1d to 1g includes nine differential amplifiers.

Each of the pre-amplifiers 1d to 1g outputs amplified differential voltage pairs <srcp1, srcm1> to <srcp9, srcm9>. These differential voltage pairs are supplied to the corresponding sine wave generators 4a to 4d in the next stage. Then, the sine wave generators 4a to 4d output 4-phase sine wave pairs <Sinp0, Sinm0> to <Sinp3, Sinm3>, respectively. These sine wave pairs are interpolated by the current interpolation circuit 5 in the further next stage. Thus, 32-phase sine wave pairs the phases of which are shifted by 5.625° sequentially are generated. Then, the sine wave pairs are binarized by the 32 comparators 6, and thereafter Gray-coded (into G4 to G0) by the Gray code encoder 7.

Figure 4A:
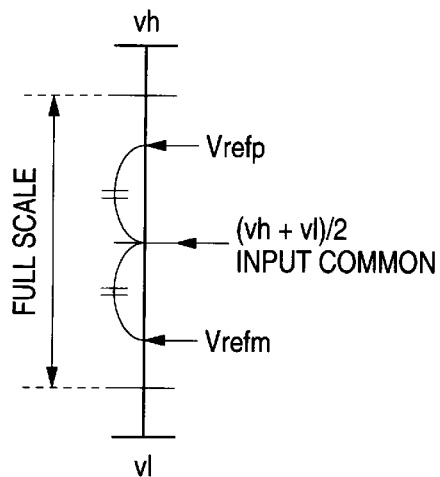
FIGS. 4A and 4B are conceptual graphs for explaining the relationship between differential analog input signals Vinp/Vinm and differential reference voltages Vrefp/Vrefm according to the embodiment of the present invention.
Figure 4B:
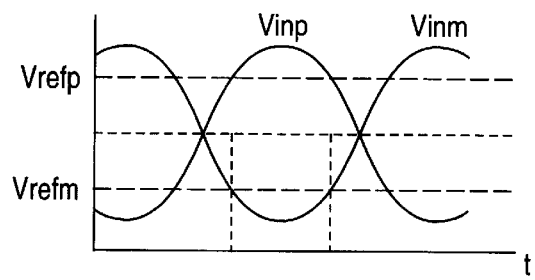

FIGS. 4A and 4B are schematic graphs for explaining the relationship between the differential analog input signals Vinp/Vinm and the differential reference voltages Vrefp/Vrefm in the above-mentioned configuration of the A/D converter. As shown in FIG. 4A, it is desired that the distance between a high voltage Vh and a low voltage Vl is divided equally by the resistor strings, and the reference voltages Vrefp and Vrefm are located in point shaving the same voltage difference from an intermediate voltage (Vh+Vl)/2 (which is a common voltage of the input signal) between the voltages Vh and Vl. When the reference voltages Vrefp and Vrefm are set thus, the voltage difference between Vinp and Vrefp always becomes equal to the voltage difference between Vinm and Vrefm as shown in FIG. 4B.

Figure 5:
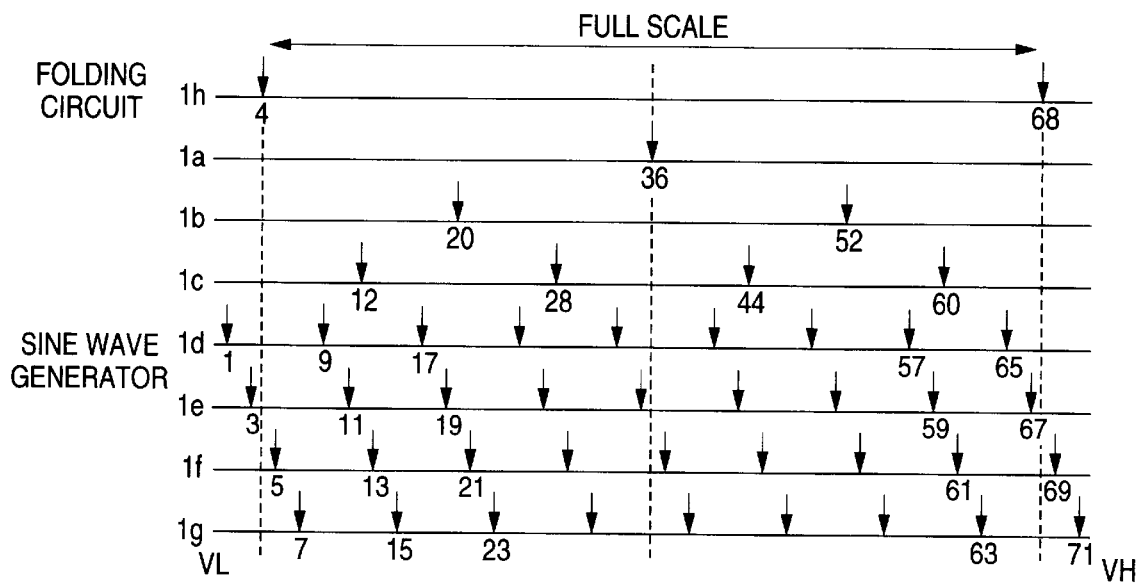
FIG. 5 is a chart showing reference voltages Vrefp of respective circuits.

FIG. 5 is a chart showing the reference voltages Vrefp for the respective circuits in the above-mentioned configuration. The reference numerals in the drawing represent voltages corresponding to the respective numbers of the connection nodes of the resistor strings. For example, in the drawing, the reference numeral 36 represents an intermediate voltage V36 (=(Vh+Vl)/2). Here, the full scale is a range of from Vp4 to Vp68. Vp4 and lower voltages are called underflow, and Vp68 and higher voltages are called overflow. Incidentally, though not shown in FIG. 5, each of the reference voltages Vrefm is expressed by the equation Vrefm=Vp72−Vrefp.

Figure 6:
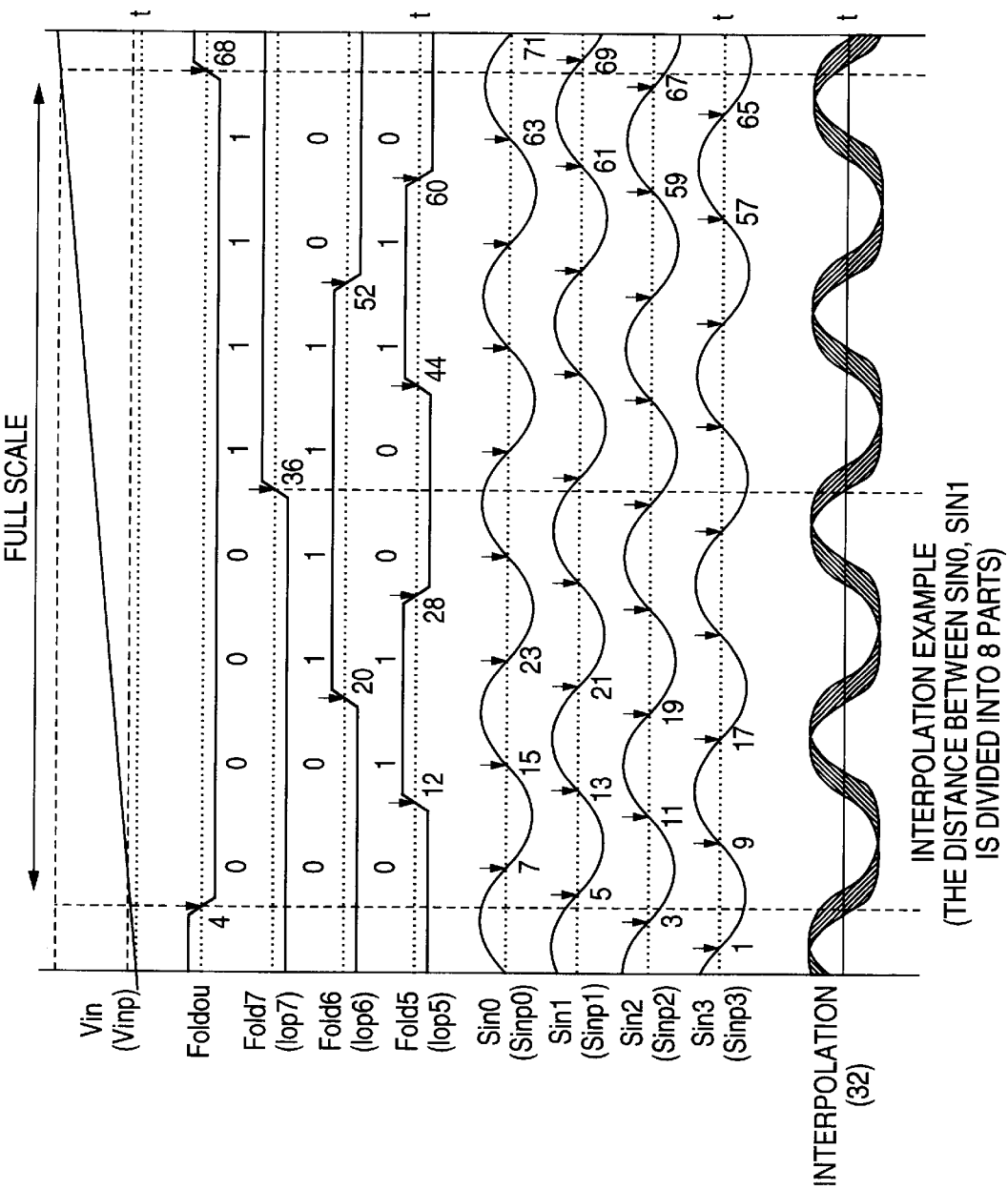
FIG. 6 is a waveform chart for explaining the operation of the A/D converter according to the embodiment of the present invention.

Next, schematic description will be made about the operation principle of the A/D converter in the above-mentioned configuration with reference to FIGS. 6 and 7. In FIG. 6, only a single input Vinp is shown as an input voltage Vin for the sake of simplification. In accordance with the input voltage Vin, the folding circuits 1a, 1b and 1c output currents Iop7, Iop6 and Iop5 folded in positions of respective reference voltages as illustrated in the drawing, respectively. (Minus-side currents Iom7, Iom6 and Iom5 are not shown.) Therefore, when the respective currents are compared, digital data (000), (001), (011), (010), (110), (111), (101) or (100) is obtained in accordance with the input voltage Vin. This digital data forms higher 3 bits of the Gray code as it is.

On the other hand, the sine wave generators 4a to 4d output 4-phase sine waves Sinp0 to Sinp3 in accordance with the input voltage Vin. (Minus-side sine waves Sinm0 to Sinm3 are not shown.) Then, the current interpolation circuit 5 outputs 32 sine waves obtained by dividing each of the 4-phase sine waves Sinp0 to Sinp3 into 8 sine waves. In FIG. 6, an example of interpolation between the sine waves Sinp0 and Sinp1 is illustrated.

When the 32 sine wave pairs are compared by the comparators 6, cycle codes V0 to V31 are obtained as shown in FIG. 7. Then, the cycle codes V0 to V31 are encoded by the Gray code encoder 7. Thus, lower 5 bits (G4 to G0) of the Gray code are obtained as illustrated in the drawing.

Next, detailed description will be made about specific circuitry and operation of each of the circuits in the above-mentioned configuration by way of example.

(1) Pre-Amplifier

Figure 8A:
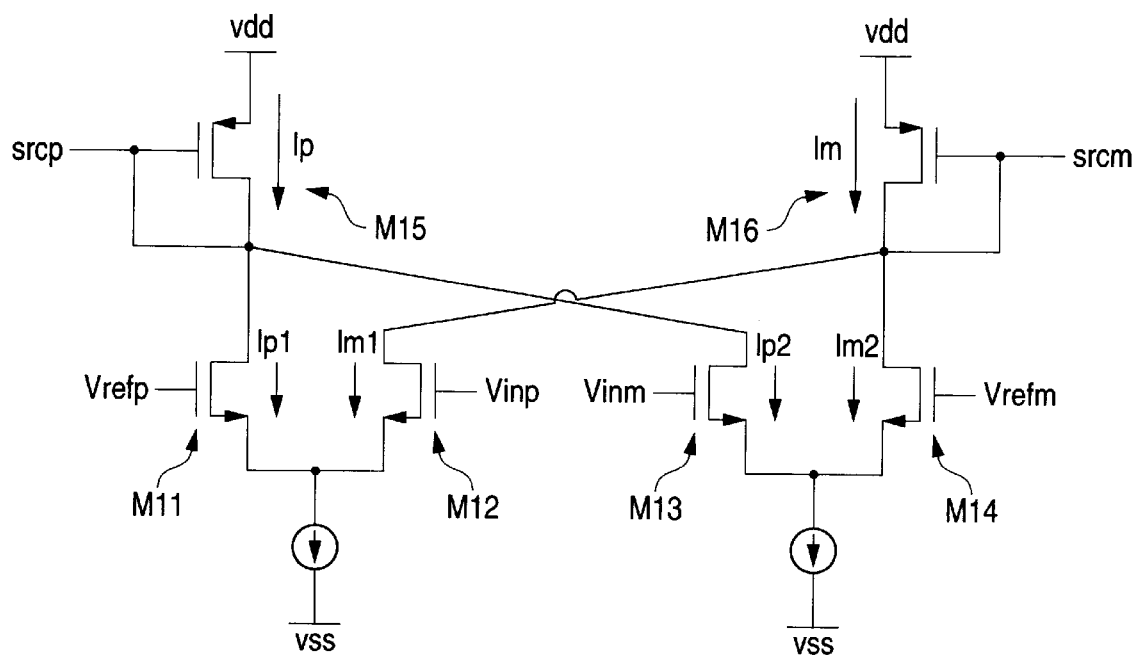
FIGS. 8A and 8B are diagrams showing the circuitry and the input/output property of pre-amplifiers 1a to 1h respectively.
Figure 8B:
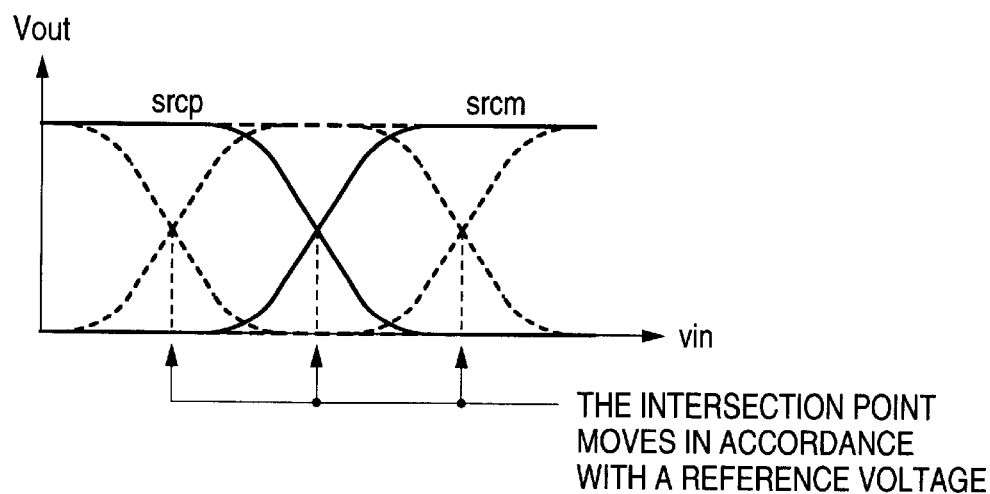

FIGS. 8A and 8B are diagrams showing the circuitry and input/output properties of each of the pre-amplifiers 1a to 1h. As shown in FIG. 8A, the differential analog input signals Vinp/Vinm are paired with the differential reference voltages Vrefp/Vrefm and supplied to the gates of differential MOS transistor pairs (M11, M12) and (M13, M14) respectively. The differential MOS transistor pairs (M11, M12) and (M13, M14) output a differential voltage pair <scrp, scrm>. The differential voltage pair <scrp, scrm> are-supplied to each of the folding circuits 2a to 2d and the sine wave generators 4a to 4d in the next stage. Incidentally, in FIG. 8A, ip1, im1, ip2, im2, Im and Ip designate currents flowing in the MOS transistors M11, M12, M13, M14, M15 and M16 respectively. Those currents have relations of Im=im1+im2 and Ip=ip1+ip2. FIG. 8B is a graph showing the input/output properties of the circuit shown in FIG. 8A. The position where the differential voltage pair <scrp, scrm> cross each other can be changed by changing the differential reference voltages Vrefp/Vrefm.

Here, it is desired that the reference voltages Vrefp/Vrefm are set to take values satisfying the following Expression 1, as has been already described above.

$(Vrefp+Vrefm)/2=(Vinp+Vinm)/2$ (Expression 1)

Figure 9B:
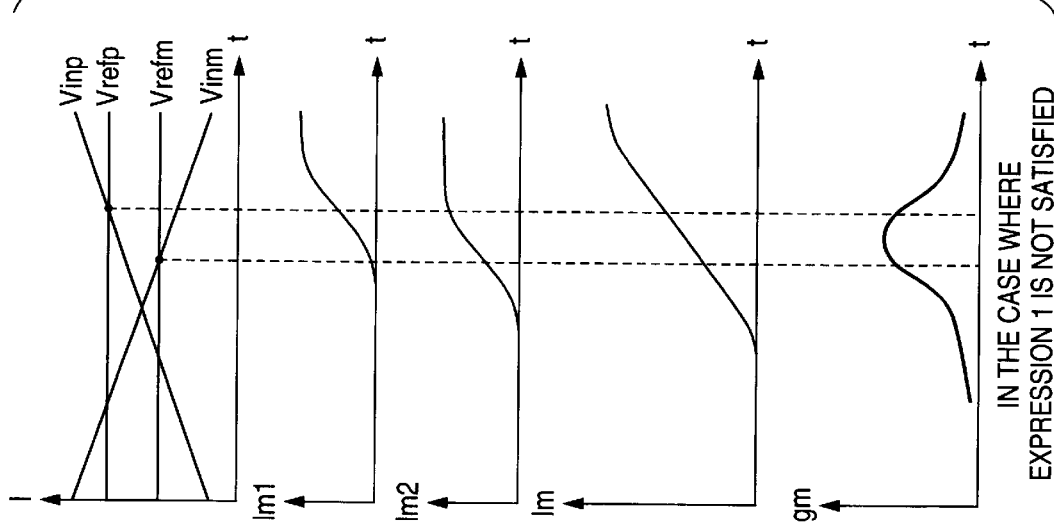
FIGS. 9A and 9B are graphs showing a variation of a transconductance gm in accordance with how to take a reference voltage in a pre-amplifier respectively.
Figure 9A:
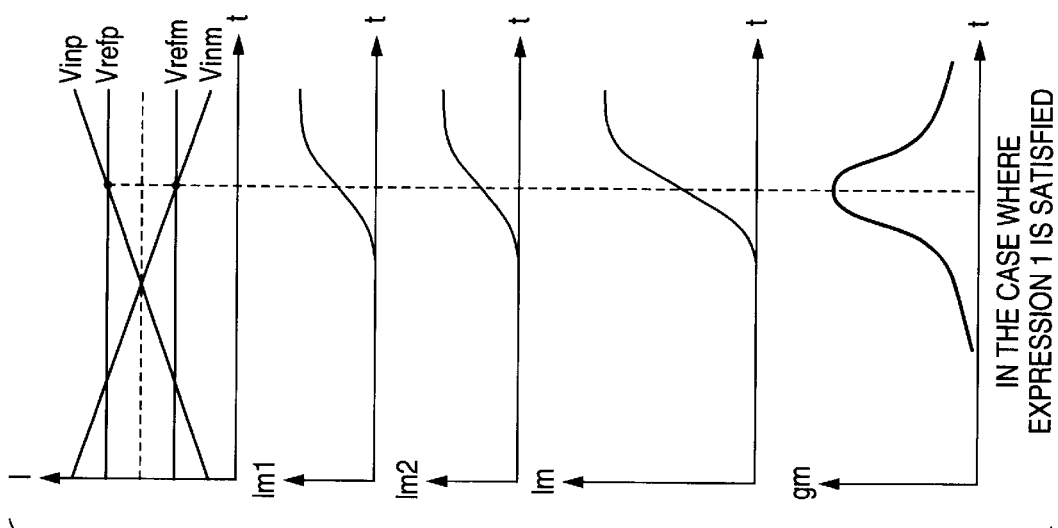

FIGS. 9A and 9B are charts showing a variation of a transconductance gm in accordance with the way to take a reference voltage in the pre-amplifiers respectively. FIG. 9A shows the case that Expression 1 is satisfied, while FIG. 9B shows the case that Expression 1 is not satisfied. As is apparent from these drawings, it is understood that the value of the transconductance gm in the case where Expression 1 is not satisfied becomes smaller than that in the case that Expression 1 is satisfied.

(2) Folding circuit

The folding circuits 2a, 2b and 2c are analog encoders for generating higher 3 bits (G7, G6 and G5). There are used three kinds of folding circuits, that is, the folding circuit 2a for G7, the folding circuit 2b for G6 and the folding circuit 2c for G5.

Figure 10:
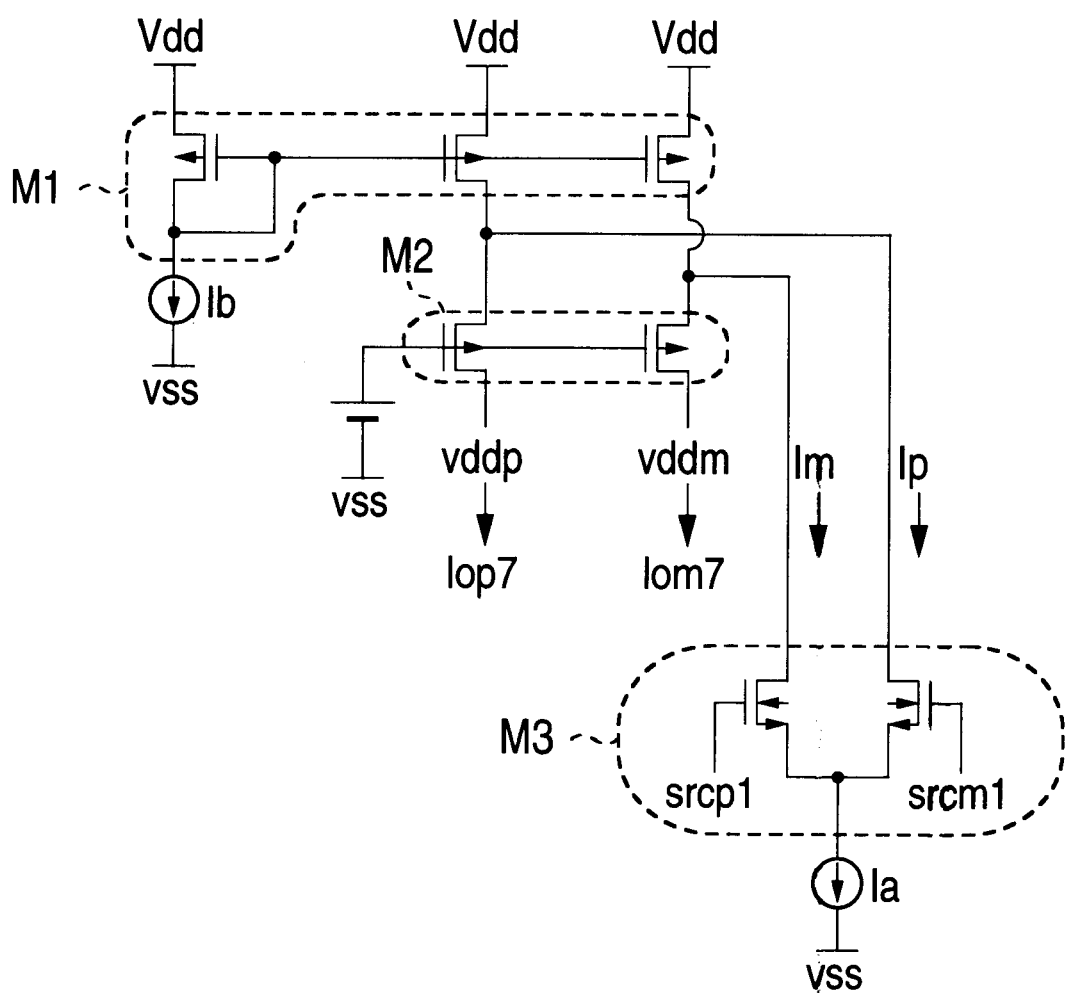
FIG. 10 is a circuit diagram showing a folding circuit 2a for G7.

FIG. 10 is a circuit diagram showing the folding circuit 2a for G7. This circuit is constituted by three blocks of a PMOS current mirror circuit (M1), a PMOS buffer (M2) and an NMOS differential transistor pair (M3). The current mirror circuit (M1) supplies a current Ib to lines vddp and vddm which are current channels. A differential voltage pair <scrp1, scrm1> outputted from the pre-amplifier 1a are applied to the differential transistor pair (M3). In addition, a current source Ia is connected to the differential transistor pair (M3). The currents Im and Ip flowing in the differential transistor pair (M3) are extracted from the currents in the lines vddp and vddm so that a differential current pair <Iop7, Iom7> are outputted from the ends of the lines vddp and vddm.

Figure 11A:
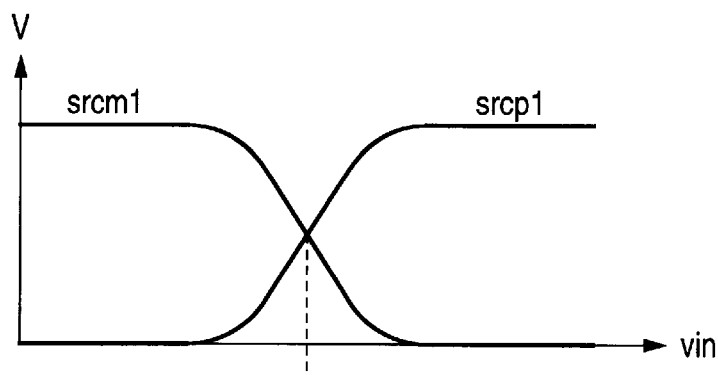
FIGS. 11A to 11D are operating waveform charts of the folding circuit 2a for G7 respectively.
Figure 11B:
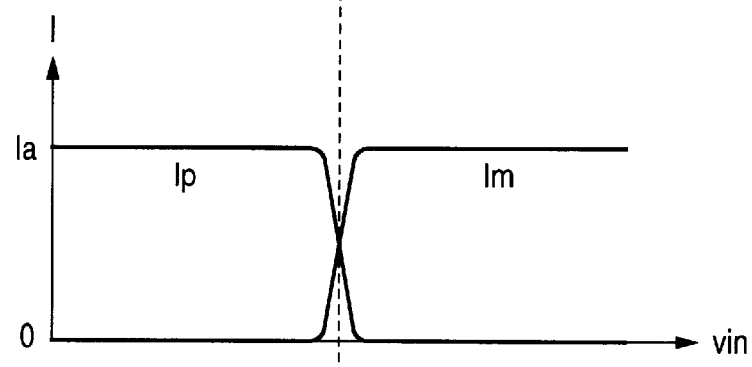
Figure 11C:
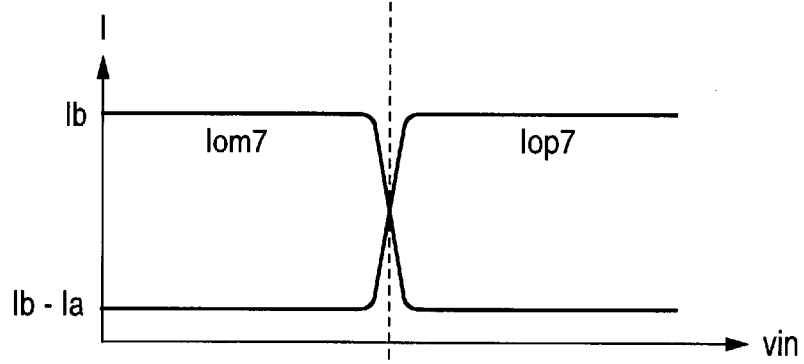
Figure 11D:
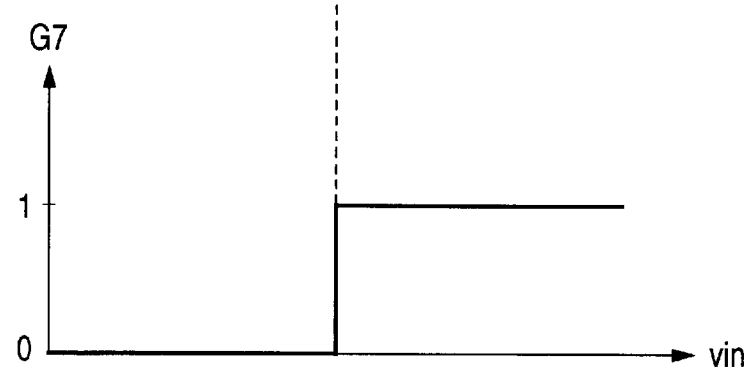

FIGS. 11A to 11D are operating waveform charts of the folding circuit 2a. Since the differential transistor pair (M3) are cross-connected to the lines vddp and vddm, the current difference between the currents Ip and Im and the current difference between the currents Iop7 and Iom7 are always equal to Ia. As shown in FIG. 11C, the differential current pair <Iop7, Iom7> have such an input/output property that the pair <iop7, Iom7> are folded in the position of a reference voltage (in the position of the intermediate voltage V36 in this case). When the differential current pair <Iop7, Iom7> are binarized by the comparator 3a, the binarized data has an input/output property shown in FIG. 11D and forms digital data for the most significant bit (G7) as it is.

In addition, the folding circuit 2a operates in a current mode so that it does not need a large voltage amplitude. Therefore, the folding circuit 2a is advantageous to a reduced voltage. Likewise, this applies to all of the circuits which will be described below.

Figure 12:
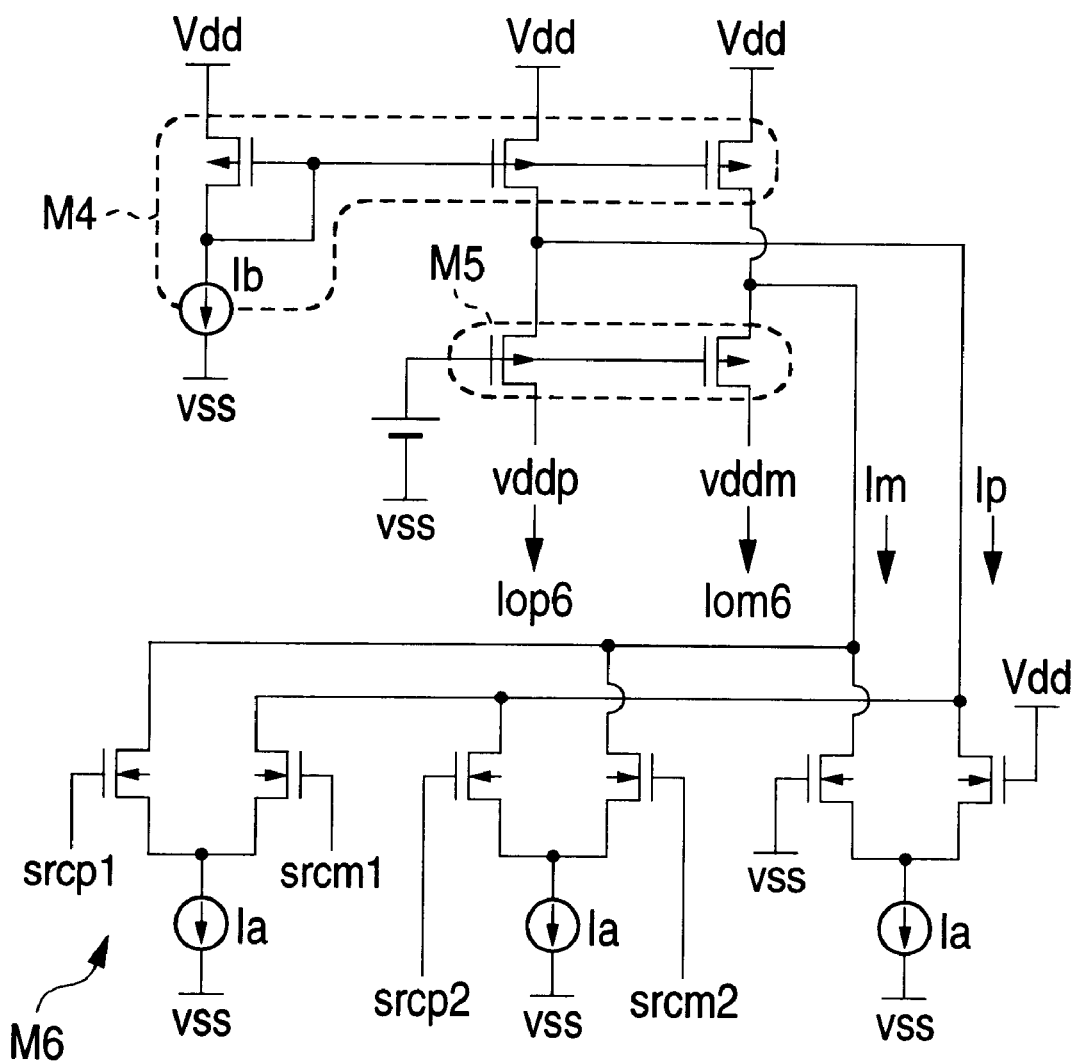
FIG. 12 is a circuit diagram showing a folding circuit 2b for G6.
Figure 13A:
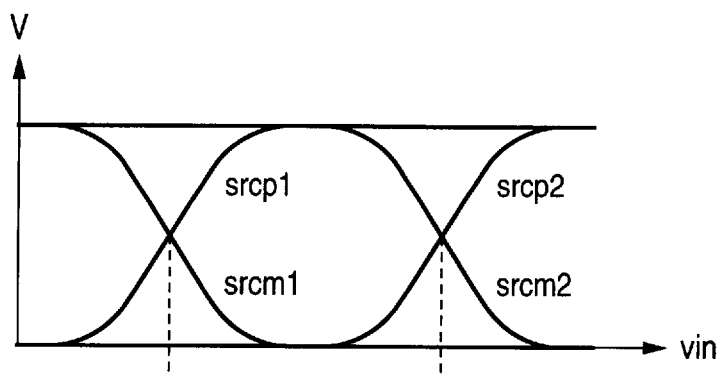
FIGS. 13A to 13D are operating waveform charts of the folding circuit 2b for G6 respectively.
Figure 13B:
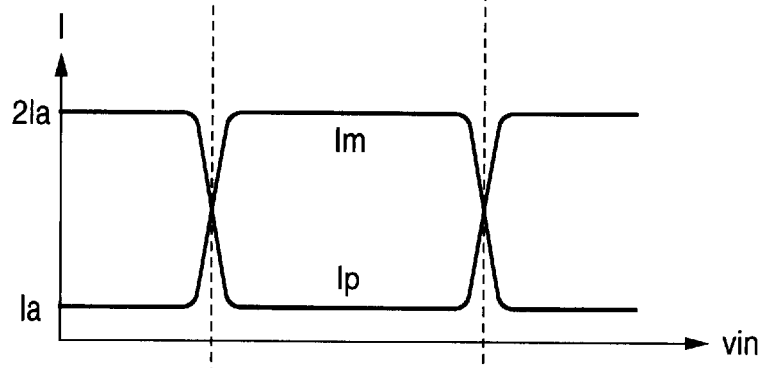
Figure 13C:
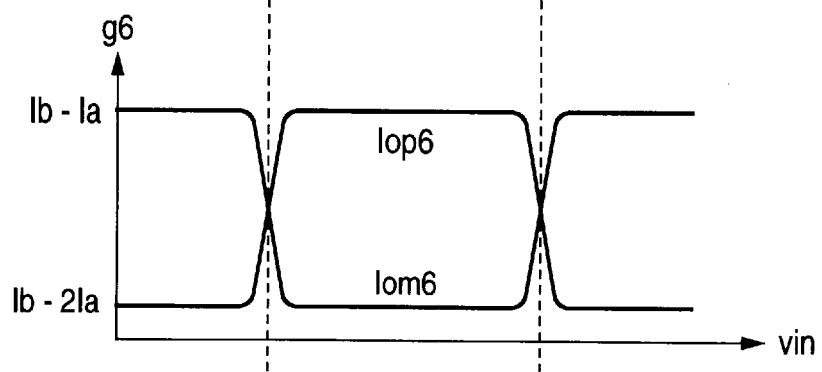
Figure 13D:
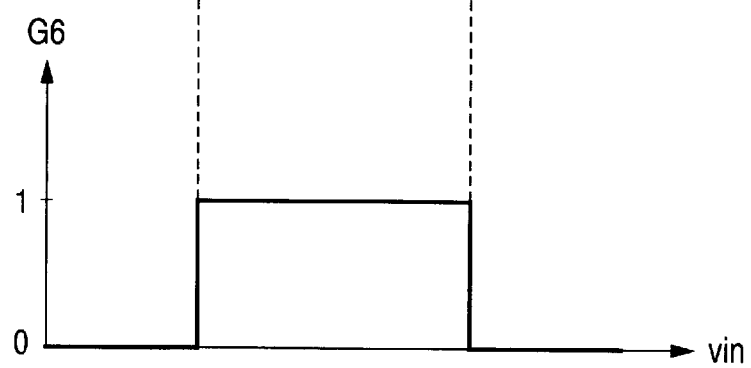

FIG. 12 is a circuit diagram showing the folding circuit 2b for G6. This circuit is constituted by three blocks of a current mirror circuit (M4), a PMOS buffer (M5) and NMOS differential transistor pairs (M6). Differential voltage pairs <scrp1, scrm1>, <scrp2, scrm2> and <Vss, Vdd> are applied to the three differential transistor pairs (M6). Incidentally, Vss designates a ground voltage, and Vdd designates a power supply voltage. The differential transistor pairs are cross-connected alternately to lines vddp and vddm. Here, the differential transistor pair to which the differential voltage pair <Vss, Vdd> are applied are provided to make a current of not lower than Ia always flow to be one of a current pair <Ip, Im>. Without such a differential transistor pair, the current pair <Ip, Im> could not form a differential signal.

FIGS. 13A to 13D are operating waveform charts of the folding circuit 2b. Since the differential transistor pairs are cross-connected, currents in a range of from Ia to 2Ia flow as the current pair <Ip, Im>. Then, a differential current pair <Iop6, Iom6> have such an input/output property that the pair <Iop6, Iom6> are folded in the positions of two reference voltages (V20 and V52). When the differential current pair <Iop6, Iom6> are binarized by the comparator 3b, the binarized data has an input/output property shown in FIG. 13D and forms digital data for a bit (G6) next to the most significant bit (G7) as it is.

Figure 14:
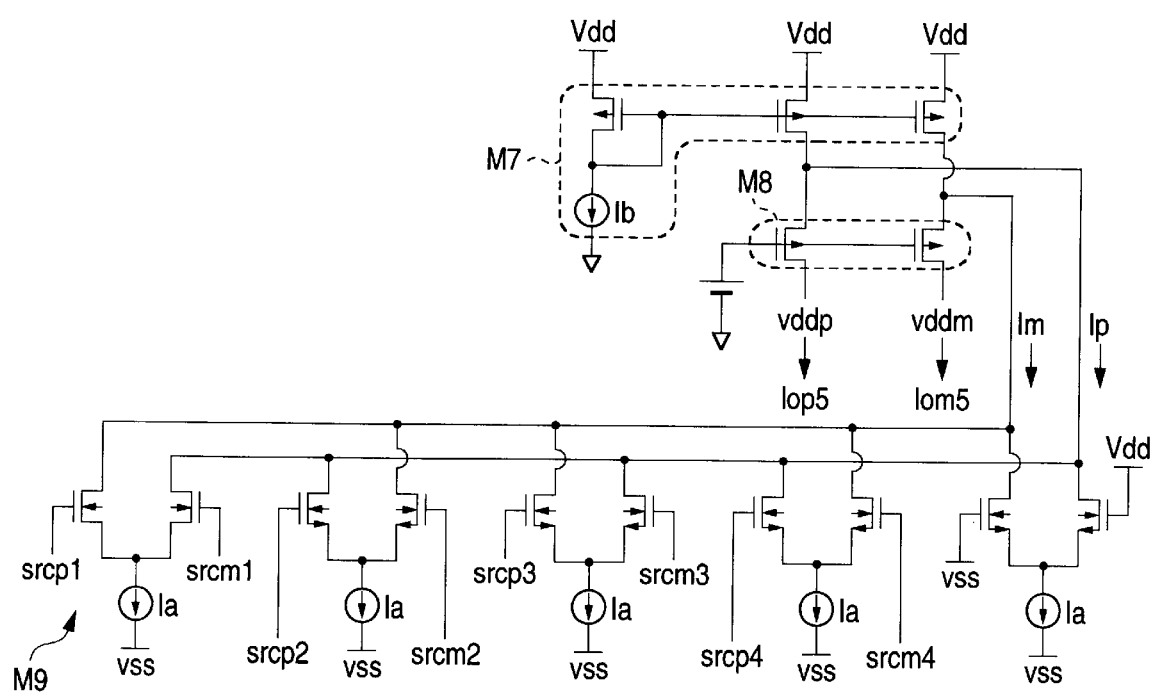
FIG. 14 is a circuit diagram showing a folding circuit 2c for G5.
Figure 15A:
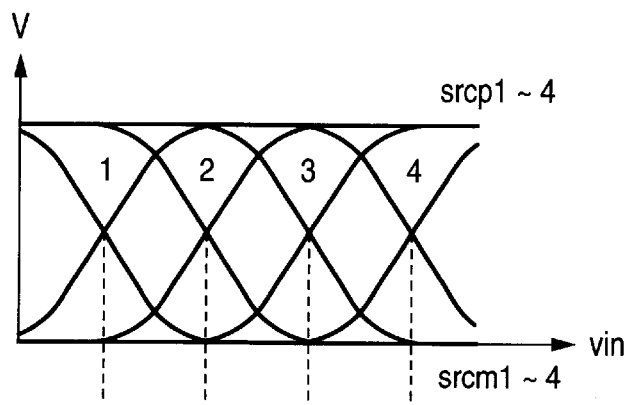
FIGS. 15A to 15D are operating waveform charts of the folding circuit 2c for G5 respectively.
Figure 15B:
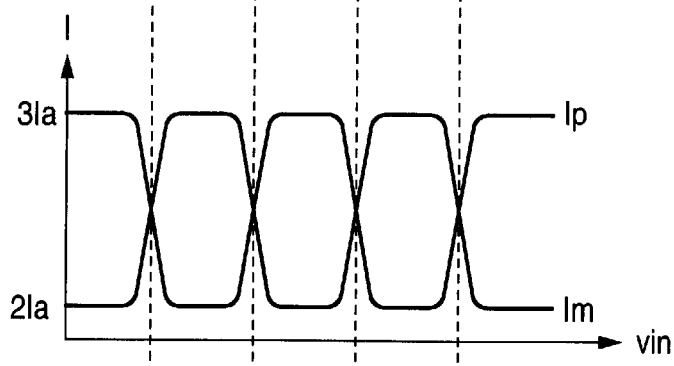
Figure 15C:
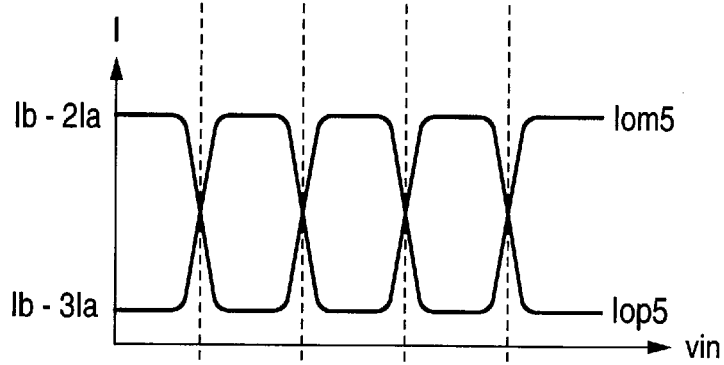
Figure 15D:
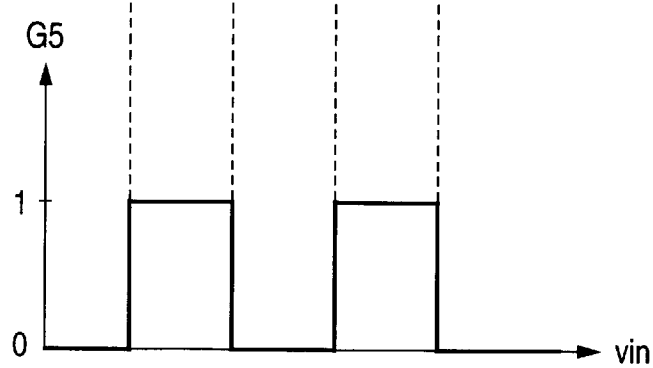

FIG. 14 is a circuit diagram showing the folding circuit 2c for G5. This circuit is constituted by three blocks of a current mirror circuit (M7), a PMOS buffer (M8) and NMOS differential transistor pairs (M9). Differential voltage pairs <scrp1, scrm1> to <scrp4, scrm4> and <Vss, Vdd> are applied to the five differential transistor pairs (M9).

FIGS. 15A to 15D are operating waveform charts of the folding circuit 2c. A differential current pair <Iop5, Ior5> have such an input/output property that the pair <Iop5, Iom5> are folded in the positions of four reference voltages. When the differential current pair <Iop5, Iom5> are binarized by the comparator 3c, the binarized data has an input/output property shown in FIG. 15D and forms digital data for a bit (G5) next to the bit (G6) as it is. In addition, it is understood from FIG. 15C that all the maximum output current differences take the value of Ia. That is, the maximum current differences can be increased if the value of the current source Ia for the differential transistor pairs is increased. Thus, the load on the comparator 3a can be reduced. In addition, the current Ib becomes a factor to define the speed of the circuit. If the current 1b is increased, the circuit speed is increased. This applies to the other folding circuits 2a and 2b.

(3) Sine Wave Generator

Figure 16A:
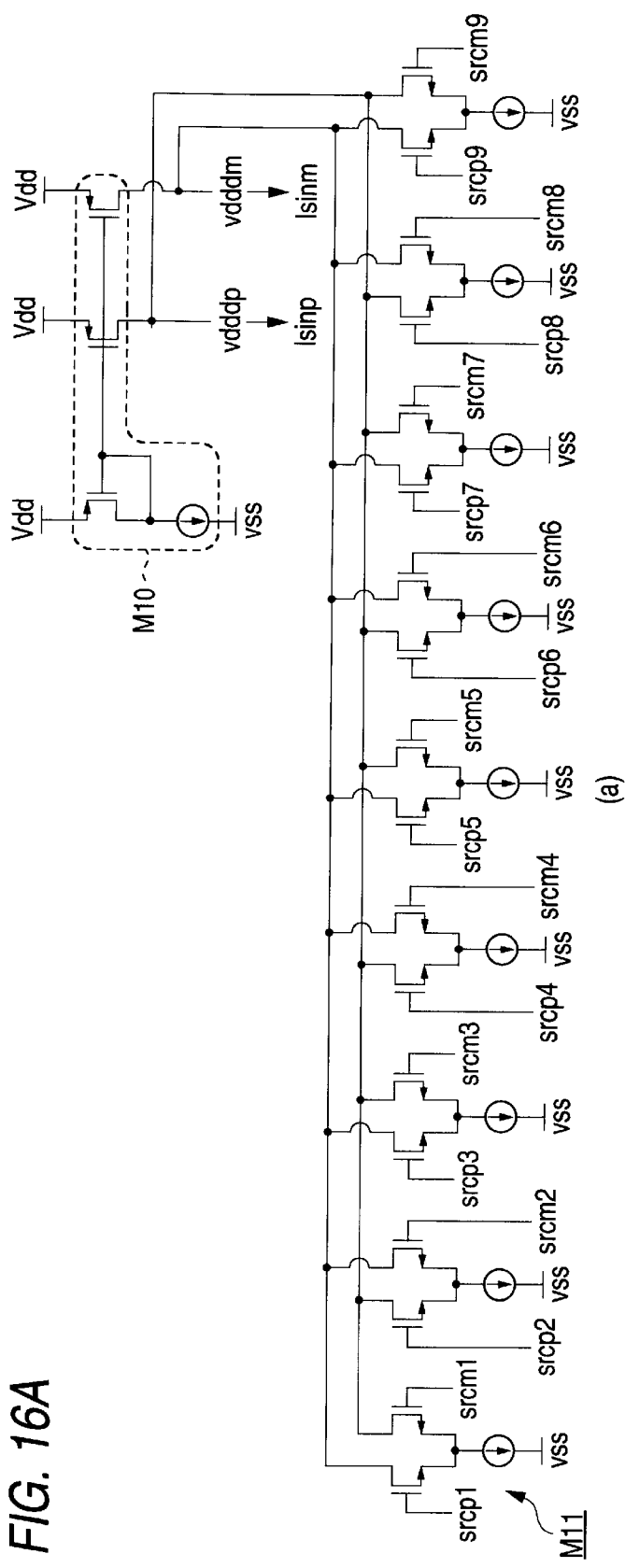
FIGS. 16A and 16B are diagrams showing the circuitry and the input/output property of a sine wave generator.
Figure 16B:
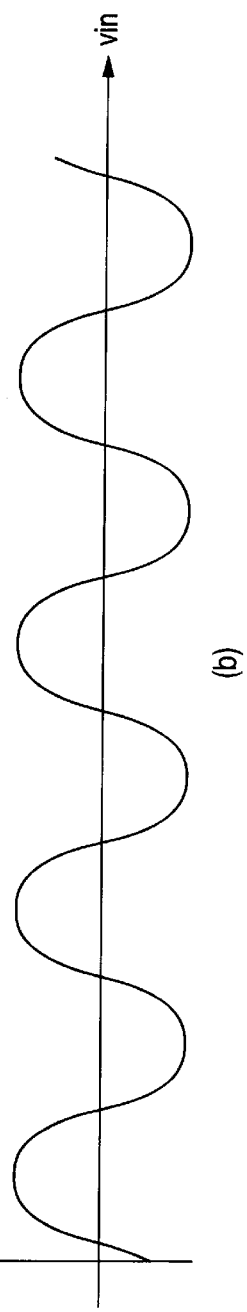

The sine wave generators 4a to 4d are analog encoders for generating lower bits. FIGS. 16A and 16B are a diagram and a chart showing a sine wave generator. With reference to the circuit diagram of FIG. 16A, the sine wave generator has, basically, a configuration similar to that of a folding circuit. That is, the sine wave generator is constituted by a current mirror circuit (M10) and NMOS differential transistor pairs (M11) Differential voltage pairs <scrp1, scrm1> to <scrp9, scrm9> are applied to the 9 differential transistor pairs (M11) respectively. In addition, the 9 differential transistor pairs are cross-connected alternately to lines vddp and vddm which are current channels. Thus, a sine wave current pair <Isinp, Isinm> are outputted from the ends of the lines vddp and vddm.

FIG. 16B is an operating waveform chart showing the input/output property (of Isin relative to Vin), having a zero-crossing point in the position of each reference voltage. Because the waveform looks like a sine wave due to such a property, the circuit is referred to as a sine wave generator. In the same manner, 4-phase sine wave pairs <Isinp0, Isinm0> to <Isinp3, Isinm3> the phases of which are shifted by 45° sequentially can be generated by four circuits which are similar to one another but have different reference voltages.

(4) Current Interpolation Circuit

Figure 17:
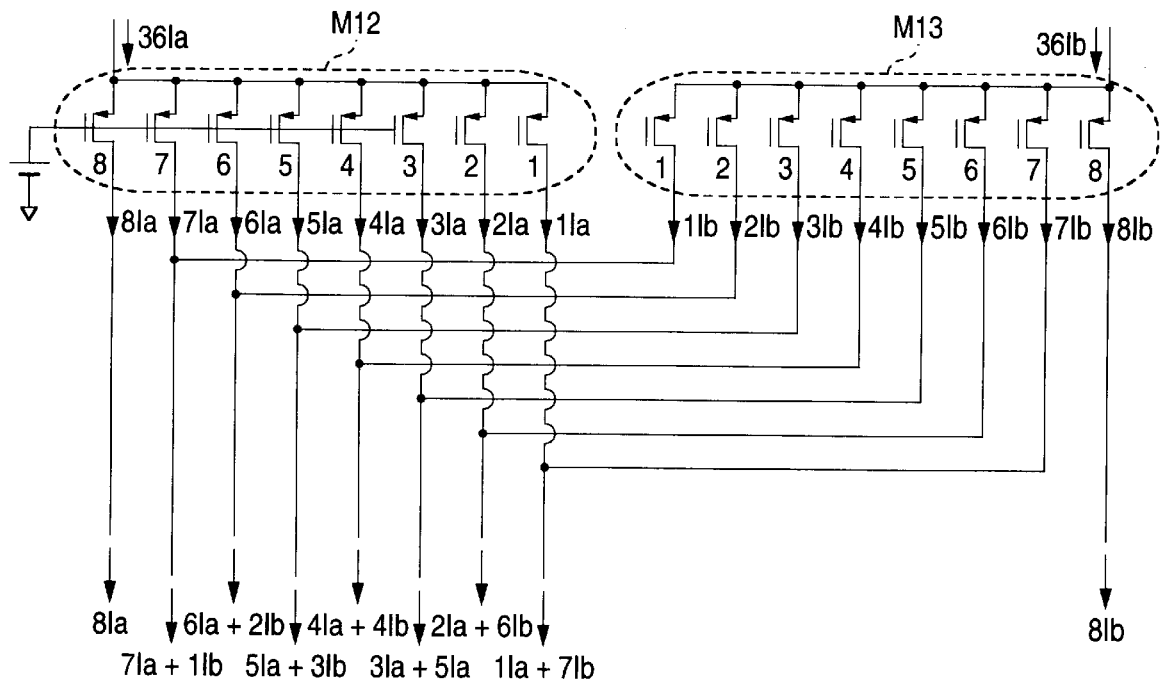
FIG. 17 is a operating waveform chart of a current interpolation circuit.

The current interpolation circuit is a circuit for interpolating the above-mentioned 4-phase sine waves with a current so as to generate 32-phase sine wave current pairs. FIG. 17 is a circuit diagram of the current interpolation circuit. For example, the two sine waves Isinp0 and Isinp1 outputted from the sine wave generators and shifted in phase by 45° sequentially are supplied as input currents 36Ia and 36Ib in FIG. 17. That is, it is characteristic that the outputs of the sine wave generators are connected directly to the inputs of the current interpolation circuit. Thus, any interface such as a buffer circuit is omitted in this configuration.

In FIG. 17, the input currents 36Ia and 36Ib are supplied to the sources of two parallel-connected MOS transistor groups M12 and M13 respectively. Numbers written in the vicinity of the respective MOS transistors designate relative magnitudes of gate widths of the transistors. Therefore, the input currents 36Ia and 36Ib are divided in accordance with the ratios of the gate widths of the MOS transistors respectively. That is, the input current 36Ia is divided into eight stages 1Ia to 8Ia, and the input current 36Ib is divided into eight stages 1Ib to 8Ib. Because the gate widths of the MOS transistors can be machined with a high accuracy by a MOS process, there is an advantage that the current division ratios can be determined with precision.

Figure 18:
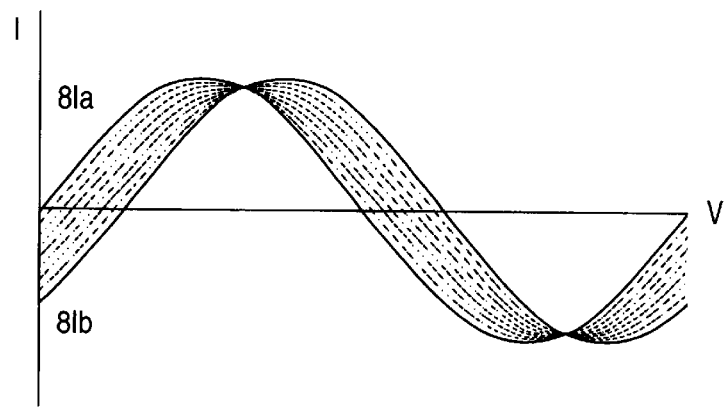
FIG. 18 is a waveform chart showing an example of interpolation based on the current interpolation circuit.

Then, the first group of the divided currents 1Ia to 7Ia are added to the second group of the divided currents 1Ib to 7Ib so that eight interpolated current signals 8Ia, 7Ia+Ib, 6Ia+2Ib, . . . can be obtained. Other sine waves are interpolated similarly. Thus, 32 sine wave pairs can be obtained. FIG. 18 is a waveform graph showing an example of such interpolation.

Incidentally, although the ratio of the gate widths of the respective MOS transistors is set to be 1:2:3:4:5:6:7:8 in the above-mentioned interpolation example, another ratio different from the above ratio may be set in consideration to the nonlinear property of sine waves. The sine wave pairs generated thus are binarized by the comparators 6, and further encoded by the Gray code encoder. Thus, lower 5 bits (G4 to G0) are generated.

(5) Comparator

Each of the comparators 3a to 3d and 6 is a circuit for comparing input Currents. If a plus-side input current is larger than a minus-side input current, the comparator outputs a digital signal 1. On the other hand, if the plus-side input current is smaller than the minus-side input current, the comparator outputs a digital signal 0. Since a known circuitry maybe used, its description is omitted here.

(6) Gray Code Encoder

The Gray code encoder is a circuit for encoding the 32-phase outputs from the current interpolation circuit into a Gray code by use of Exclusive OR circuits which will be described later. That is, the following operations are given to the cycle code outputs V0 to V31 of the comparators shown in FIG. 7 so as to convert the outputs V0 to V31 into a Gray code.

G4=V28

G3=V4*V20

G2=V0*V8*V16*V24

G1=V2*V6*V10*V14*V18*V22*V26*V30

G0=V1*V3*V5*V7*V9*V11*V13*V15
 *V17*V19*V21*V23*V25*V27*V29*V31

ERRC=V12 wherein the symbol * designates Exclusive OR.

The present invention has main effects as follows.

By adopting a folding/interpolation architecture as an analog preprocessing circuit in an input stage of an A/D converter, the total circuit quantity and the total power consumption can be reduced on a large scale while keeping a speed equal to that in a conventional parallel-connected A/D converter. For example, in the case of 8-bit resolution, about 40 comparators are required (while 256 comparators are required in the parallel-connected type). In addition, since a current interpolation circuit is used for lower bits, a digital encoder is reduced in size on a large scale. As a result, both the circuit quantity and the power consumption of the A/D converter according to the present invention as a whole are reduced to about ¼ in comparison with the conventional parallel-connected A/D converter.

Further, since CMOS analog preprocessing circuits (folding circuits, sine wave generators, and a current interpolation circuit) operating in a current mode are introduced, a low voltage operation can be carried out. In addition, the A/D converter according to the present invention can be provided by an integrated circuit of fine CMOS transistors. According to circuit simulation, it was proved that the A/D converter according to the present invention could be operated with power supply voltage of 3V.

Furthermore, the sine wave generators and the current interpolation circuit are constituted by CMOS while the outputs of the sine wave generators are connected directly to the inputs of the current interpolation circuit. Accordingly, the circuitry is simplified while a high-speed operation can be carried out.

What is claimed is:

1. An A/D converter for converting an input analog signal into a Gray code of higher m bits and lower n bits, comprising:
    m folding circuits for being supplied with differential analog signal pairs and differential reference voltage pairs and for outputting folded differential current pairs respectively;
    m first comparators for comparing said differential current pairs outputted by said folding circuits and for outputting said higher m bits of said Gray code;
    a plurality of sine wave generators for being supplied with said differential analog signal pairs and said differential reference voltage pairs and for outputting multi-phase sine wave pairs respectively;
    a current interpolation circuit for interpolating said multi-phase sine wave pairs and for outputting $2^n$ sine wave pairs;
    $2^n$ second comparators for comparing said sine wave pairs and for outputting binary data respectively; and
    a Gray code encoder for encoding said binary data into a Gray code of lower n bits;
    wherein said lower n bits of said Gray code are outputted from said Gray code encoder.

2. An A/D converter according to claim 1, further comprising;
    a track hold circuit for temporarily holding and outputting levels of said differential analog signal pairs in accordance with a clock signal;
    wherein said analog signal pairs are supplied, through said track hold circuit, to said folding circuits and said sine wave generators, said first and second comparators being operated synchronously with said clock signal.

3. An A/D converter according to claim 2, further comprising:
    pre-amplifiers for amplifying potential differences between said analog signal pairs and said reference voltage pairs and for outputting differential voltage pairs respectively;
    wherein outputs of said pre-amplifiers are supplied to said folding circuits.

4. An A/D converter according to claim 3, said folding circuits including:
    differential MOS transistor pairs having gates supplied with said differential voltage pairs respectively;
    a current source for supplying a first current to said differential MOS transistor pairs; and
    a current mirror circuit for supplying a second current to a pair of current channels;
    wherein drains of said differential MOS transistor pairs are cross-connected alternately to said pair of current channels so that folded differential current pairs are outputted from ends of said pair of current channels.

5. An A/D converter according to claim 1, further comprising:
    pre-amplifiers for amplifying potential differences between said analog signal pairs and said reference voltage pairs and for outputting differential voltage pairs respectively;
    wherein outputs of said pre-amplifiers are supplied to said folding circuits.

6. An A/D converter according to claim 5, said folding circuits including:
    differential MOS transistor pairs having gates supplied with said differential voltage pairs respectively;
    a current source for supplying a first current to said differential MOS transistor pairs; and
    a current mirror circuit for supplying a second current to a pair of current channels;
    wherein drains of said differential MOS transistor pairs are cross-connected alternately to said pair of current channels so that folded differential current pairs are outputted from ends of said pair of current channels.

7. An A/D converter for outputting a digital signal of m+n bits, comprising:
    folding circuits for being supplied with differential analog signals and for outputting higher m bits of said digital signal respectively;
    sine wave generators for being supplied with said differential analog signals and for outputting lower n bits of said digital signal respectively; and
    a current interpolation circuit for interpolating outputs of said sine wave generators;
    said folding circuits including:
        at least one differential MOS transistor pair having gates supplied with differential voltage pairs which are differences between said differential analog signals and differential reference voltages, respectively;
        a current source for supplying a first current to said differential MOS transistor pairs; and
        a current mirror circuit for supplying a second current to a pair of current channels;
    wherein drains of said differential MOS transistor pairs are cross-connected alternately to said pair of current channels so that folded differential current pairs are outputted from ends of said pair of current channels.

8. An A/D converter according to claim 7, further comprising a current comparator for comparing said differential current pair and for outputting a Gray-coded digital signal.

9. An A/D converter for outputting a digital signal of m+n bits, comprising:
    folding circuits for being supplied with differential analog signals and for outputting higher m bits of said digital signal respectively;
    sine wave generators for being supplied with said differential analog signals and for outputting lower n bits of said digital signal respectively; and
    a current interpolation circuit for interpolating outputs of said sine wave generators;
    said sine wave generators including:
        a plurality of differential MOS transistor pairs having gates supplied with differential voltage pairs which are differences between said differential analog signals and differential reference voltages, respectively;
        a current source for supplying a first current to said differential MOS transistor pairs; and
        a current mirror circuit for supplying a second current to a pair of current channels;

wherein drains of said differential MOS transistor pairs are cross-connected alternately to said pair of current channels so that sine wave currents are outputted from ends of said pair of current channels.

10. An A/D converter according to claim 9, wherein said current interpolation circuit makes current interpolation among a plurality of sine wave currents the phases of which are shifted sequentially, and said current interpolation circuit includes:

current dividing means for dividing said sine wave current into a plurality of currents in a predetermined ratio; and adding means for adding said divided currents so as to make current interpolation among said plurality of sine wave currents;

wherein said sine wave current is supplied directly to said current dividing means.

11. An A/D converter according to claim 10, wherein said current dividing means is constituted by a plurality of MOS transistors which are different in gate width from each other and which are connected in parallel.

* * * * *